United States Patent
Hsieh et al.

(10) Patent No.: US 10,141,359 B2
(45) Date of Patent: Nov. 27, 2018

(54) IMAGE SENSOR (71) Applicant: HIMAX TECHNOLOGIES LIMITED, Tainan (TW)

(72) Inventors: Yu-Jui Hsieh, Tainan (TW); Po-Nan Chen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 15/446,011

(22) Filed: Mar. 1, 2017

(65) Prior Publication Data
US 2018/0254296 A1    Sep. 6, 2018

(51) Int. Cl.
| | |
|---|---|
| *H01L 27/146* | (2006.01) |
| *H04N 5/33* | (2006.01) |
| *H04N 9/04* | (2006.01) |
| *H04N 9/07* | (2006.01) |
| *G02B 5/20* | (2006.01) |

(52) U.S. Cl.
CPC ........ *H01L 27/14621* (2013.01); *G02B 5/201* (2013.01); *G02B 5/208* (2013.01); *H01L 27/14645* (2013.01); *H01L 27/14649* (2013.01); *H01L 27/14685* (2013.01); *H04N 5/332* (2013.01); *H04N 9/045* (2013.01); *H04N 9/07* (2013.01); *H04N 2209/047* (2013.01)

(58) Field of Classification Search
CPC ...... H01L 23/535; H01L 23/481; H01L 29/41
See application file for complete search history.

(56) References Cited

U.S. PATENT DOCUMENTS

| | | | |
|---|---|---|---|
| 2006/0145197 A1 | 7/2006 | Baek | |
| 2011/0181948 A1* | 7/2011 | Kindler | ................ G03B 21/56 359/454 |
| 2011/0235017 A1* | 9/2011 | Iwasaki | ................ H04N 5/2354 356/4.01 |
| 2015/0381907 A1 | 12/2015 | Boettiger et al. | |
| 2016/0099272 A1 | 4/2016 | Wang | |

FOREIGN PATENT DOCUMENTS

| | | |
|---|---|---|
| JP | 2010-288274 A | 12/2010 |
| TW | 201614820 A | 4/2016 |

* cited by examiner

*Primary Examiner* — Marc Armand
*Assistant Examiner* — Sarah Salerno
(74) *Attorney, Agent, or Firm* — CKC & Partner Co., Ltd.

(57) ABSTRACT

An image sensor is provided. The image sensor includes an infrared receiving portion and a visible light receiving portion. The infrared receiving portion is configured to receive infrared. The visible light receiving portion is configured to receive a visible light. The visible light receiving portion includes an infrared cutoff filter grid configured to purify the visible light.

13 Claims, 9 Drawing Sheets

IMAGE SENSOR

BACKGROUND

Field of Invention

The present invention relates to an image sensor. More particularly, the present invention relates to an image sensor having infrared sensing function.

Description of Related Art

With the development of the access control systems and security systems, the biometric technologies using human characteristics to confirm personal identity becomes prevalent. Iris recognition technology is a popular one of the biometric technologies since the iris recognition technology has high reliability. When the iris recognition technology is applied in an electronic device, such as a smart phone, an image sensor capable of receiving visible light and infrared separately is required to implement iris recognition function. A conventional image sensor has two different portions for receiving visible light and infrared separately.

SUMMARY

The present invention provides an image sensor. The image sensor includes an infrared receiving portion and a visible light receiving portion. The infrared receiving portion is configured to receive infrared. The visible light receiving portion is configured to receive a visible light. The visible light receiving portion includes an infrared cutoff filter grid configured to purify the visible light.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1:
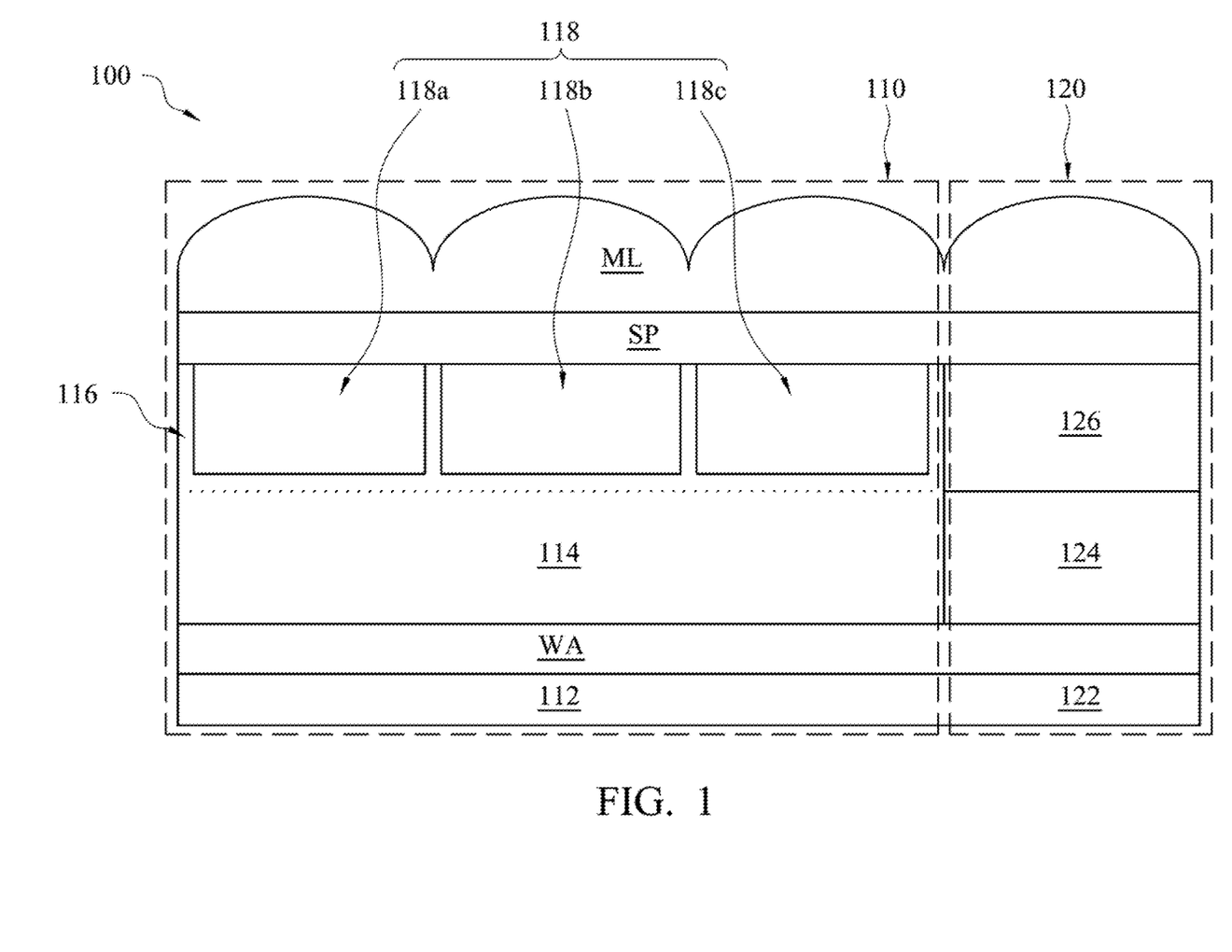
FIG. 1 is a cross-sectional view of an image sensor according to an embodiment of the present invention.

FIG. 1 is a cross-sectional view of an image sensor 100 according to an embodiment of the present invention. As shown in FIG. 1, the image sensor 100 includes a visible light receiving portion 110 and an infrared receiving portion 120. The visible light receiving portion 110 is configured to receive a visible light, and the infrared receiving portion 120 is configured to receive infrared.

As shown in FIG. 1, the visible light receiving portion 110 includes a visible light sensing layer 112, an infrared cutoff filter 114, an infrared cutoff filter grid 116 and a color filter 118. The color filter 118 is disposed on the infrared cutoff filter 114 and the infrared cutoff filter 114 is disposed on the visible light sensing layer 112 to provide color light to the visible light sensing layer 112, and the visible light sensing layer 112 is configured to receive the visible light to generate main image signals accordingly. In this embodiment, the visible light sensing layer 112 includes at least one photodiode for sensing the color light, and the photodiode may be a complementary metal oxide semiconductor (CMOS) diode. However, embodiments of the present invention are not limited thereto.

The infrared cutoff filter grid 118 is filled with the color filter 118 to provide the color light. In this embodiment, the color filter 118 includes a red color filter unit 118a, a blue color filter unit 118b and a green color filter unit 118c, but embodiments of the present invention are not limited thereto.

The infrared cutoff filter 114 is configured to cutoff the infrared. In other words, the infrared cutoff filter 114 can block the transmission of the infrared, while passing the light. In this embodiment, the infrared cutoff filter 114 blocks lights having a wavelength greater than 850 nm, but embodiments of the present invention are not limited thereto.

As shown in FIG. 1, the infrared receiving portion 120 includes an infrared sensing layer 122, a first filter 124 and a second filter 126. The second filter 126 is disposed on the first filter 124 and the first filter 124 is disposed on the infrared sensing layer 122 to provide the infrared to the infrared sensing layer 122, and the infrared sensing layer 122 is configured to receive the infrared to generate auxiliary image signals accordingly. In this embodiment, the infrared sensing layer 122 includes at least one photodiode for sensing the infrared, and the photodiode may be a CMOS diode. However, embodiments of the present invention are not limited thereto.

In this embodiment, one of the first filter 124 and the second filter 126 is an infrared pass filter. The other one of the first filter 124 and the second filter 126 is a white filter or the infrared pass filter. The infrared pass filter is configured to cutoff the visible light. In other words, the infrared pass filter can block the transmission of the visible light, while passing the light. In this embodiment, the infrared pass filter blocks lights having a wavelength smaller than 850 nm, but embodiments of the present invention are not limited thereto. The white filter is configured to allow the passage of the infrared. In this embodiment, the white filter is a white photoresist, but embodiments of the present invention are not limited thereto.

Figure 2:
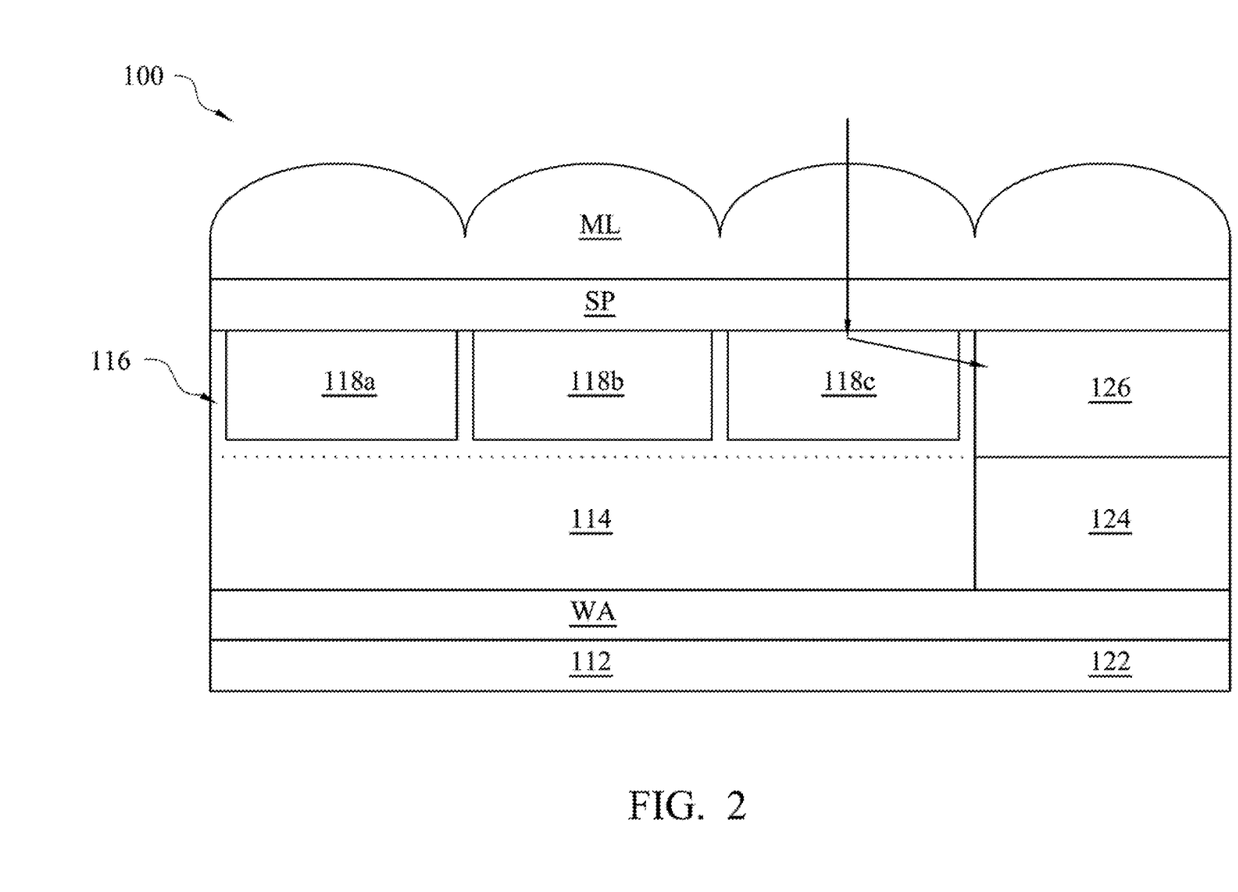
FIG. 2 is a cross-sectional view showing a light passing the image sensor according to an embodiment of the present invention.
Figure 3:
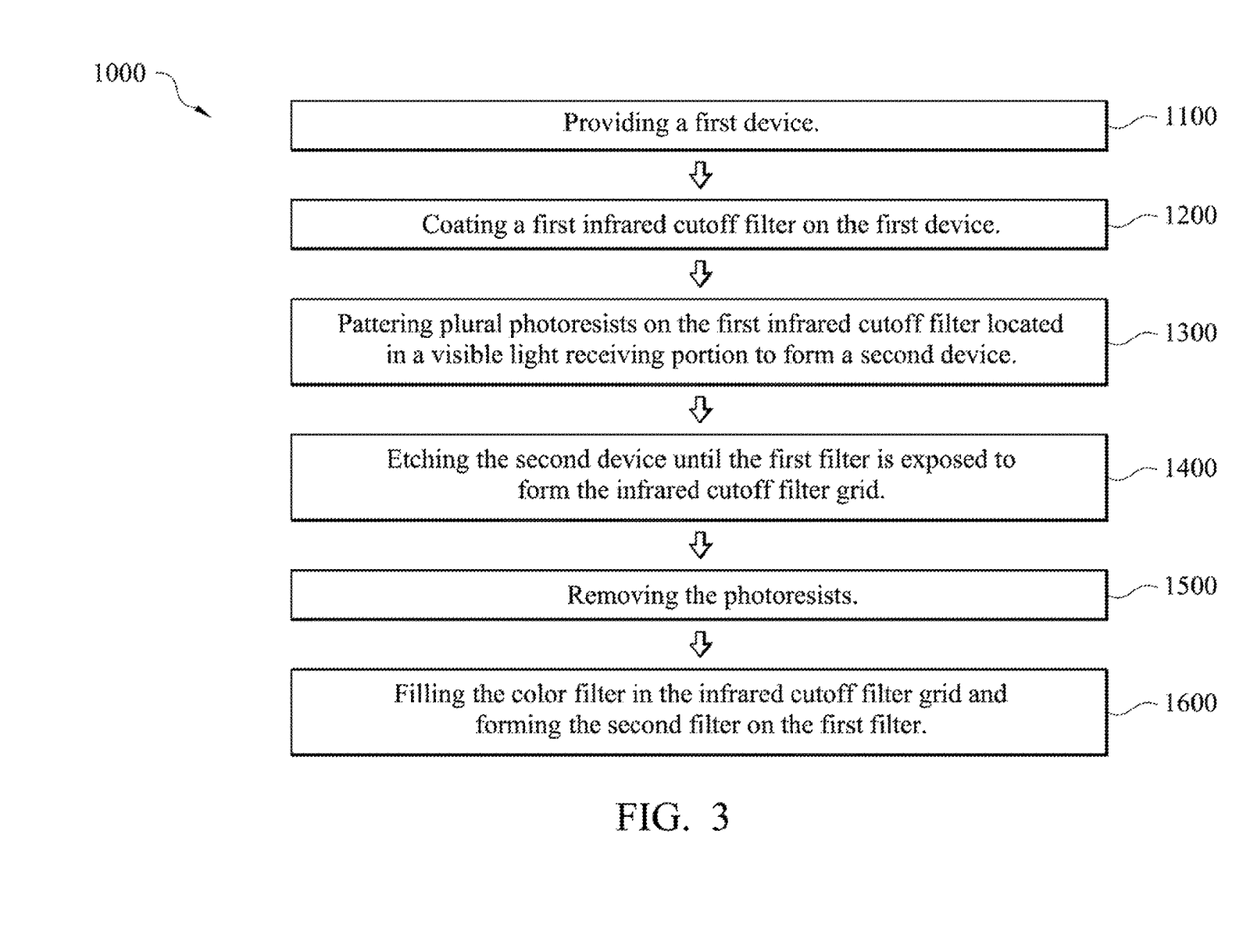
FIG. 3 is a flow chart showing a method for forming the image sensor according to the embodiment of the present invention.

As shown in FIG. 1, the infrared cutoff filter grid 116 is disposed on the infrared cutoff filter 114 to purify the visible light. FIG. 2 is a cross-sectional view showing a light passing the image sensor 100 according to the embodiment of the present invention. As shown in FIG. 2, the light passing the color filter units (such as the green color filter unit 118c) not only longitudinally passes through the color filter units, but also laterally enters the adjacent color filter units or the adjacent second filter 126. The infrared cutoff filter grid 116 is configured to block the transmission of the infrared laterally passing the color filter 118, thereby purifying the visible light received by the image sensor 100. Therefore, the visible light received by the image sensor 100 has a smaller noise.

As shown in FIG. 1, the visible light receiving portion 110 and the infrared receiving portion 120 further include a wafer WA, a spacer layer SP and a micro-lens layer ML. The wafer WA is used to provide a substrate on which the infrared cutoff filter 114 and the first filter 124 are formed. In this embodiment, the wafer WA is a glass wafer, but embodiments of the present invention are not limited thereto.

The spacer layer SP is located on the color filter 118 and the second filter 126 to provide a flat surface on which the micro-lens layer ML is disposed. It is noted that a sum of a thickness of the infrared cutoff filter 114 and a thickness of the infrared cutoff filter grid 116 and the color filter 118 is substantially equal to a sum of a thickness of the first filter 124 and a thickness of the second filter 126 in this embodiment. The micro-lens layer ML is configured to collect the infrared and the visible light. Specifically, when the image sensor 100 is used to sense an object (for example iris), the object is focused though the micro-lens layer ML. Further, focus of the image sensor 100 can be adjusted by varying a thickness of the micro-lens layer ML.

It is noted that the material of the micro-lens layer ML may be epoxy, optical cement, polymethylmethacrylates (PMMAs), polyurethanes (PUs) polydimethylsiloxane (PDMS), or other thermal curing or photo-curing transparent materials, but the present invention is not limited thereto.

In comparison with the conventional image sensor, the image sensor 100 doesn't need a planar layer since the infrared cutoff filter grid 116 provides a suitable structure to receive the color filter 118, thereby decreasing the light path of the visible light and the infrared received by the image sensor 100. Therefore, the visible light and the infrared received by the image sensor 100 have a smaller loss of the intensity. Furthermore, in comparison with the conventional image sensor, the visible light received by the image sensor 100 has smaller noise since the cutoff filter grid 116 is configured to purify the visible light.

Figure 4A:
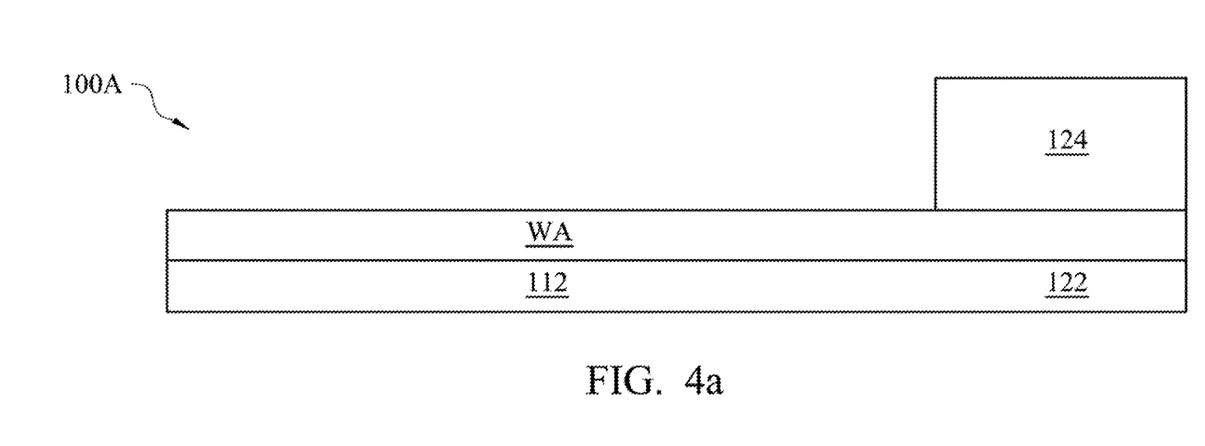
FIGS. 4a-4g are cross-sectional views of the image sensor corresponding to the steps of the method for forming the image sensor in accordance with the embodiment of the present invention.

Referring to FIG. 3 and FIGS. 4a-4g, FIG. 3 is a flow chart showing a method 1000 for forming the image sensor 100 according to the embodiment of the present invention, and FIGS. 4a-4g are cross-sectional views of the image sensor 100 respectively corresponding to the steps 1100-1600 of the method 1000 for forming the image sensor 100 in accordance with the embodiment of the present invention. The method 1000 starts from step 1100. In step 1100, a first device 100A is provided as shown in FIG. 4a The first device 100A includes the visible light sensing layer 112, the infrared sensing layer 122, the wafer WA, and the first filter 124.

Figure 4B:
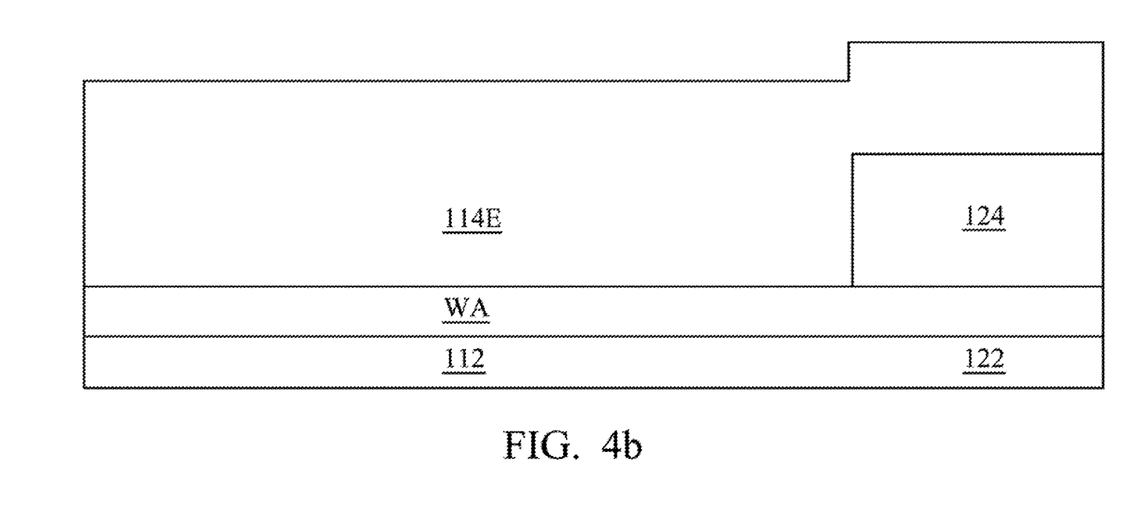
Figure 4C:
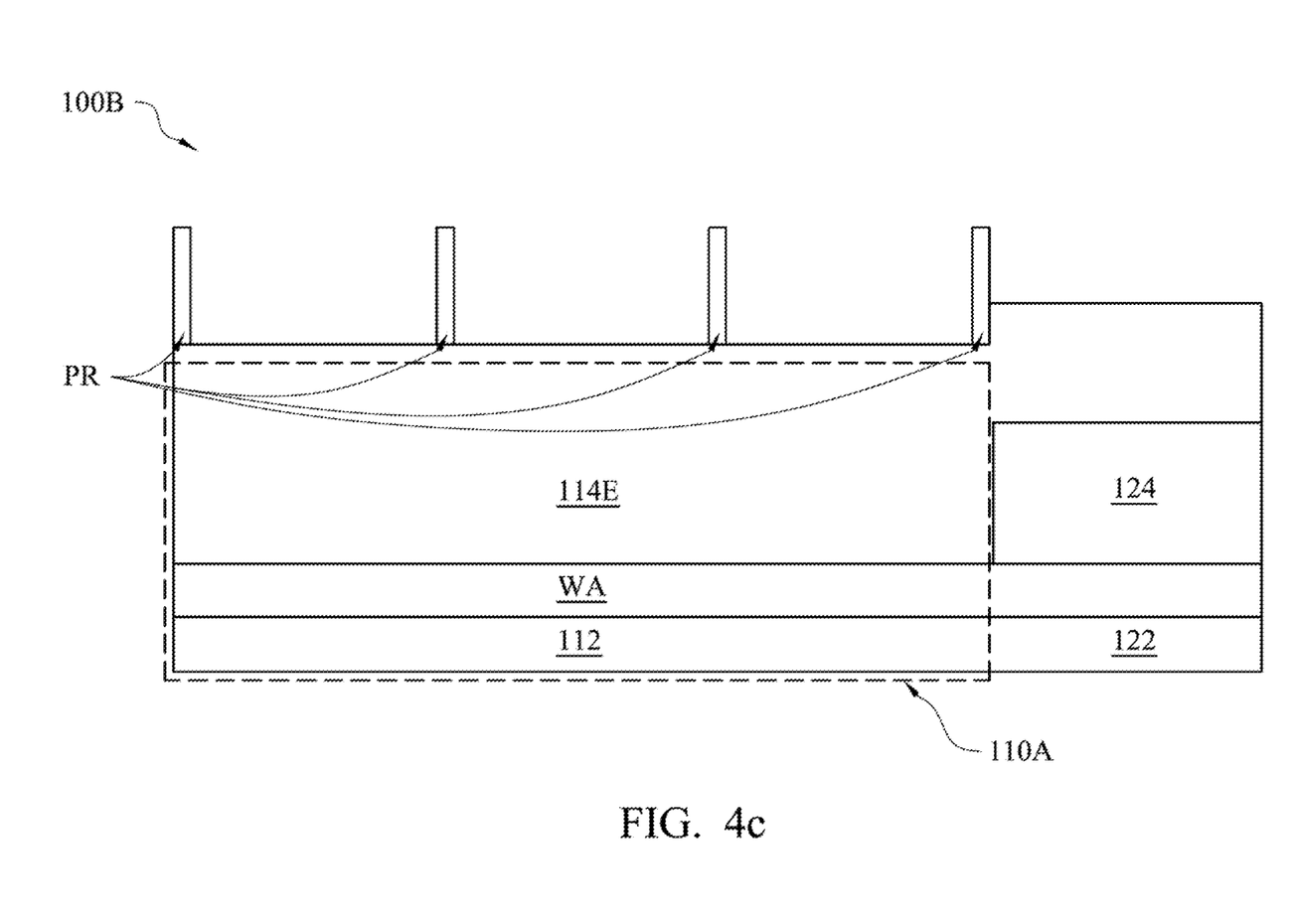

As shown in FIG. 4b, in step 1200 of the method 1000, a first infrared cutoff filter 114E is coated on the first device 100A. Next, as shown in FIG. 4c, in step 1300 of the method 1000, plural photoresists PR are patterned on the first infrared cutoff filter 114E located in a visible light receiving portion 110A to form a second device 100B.

Figure 4D:
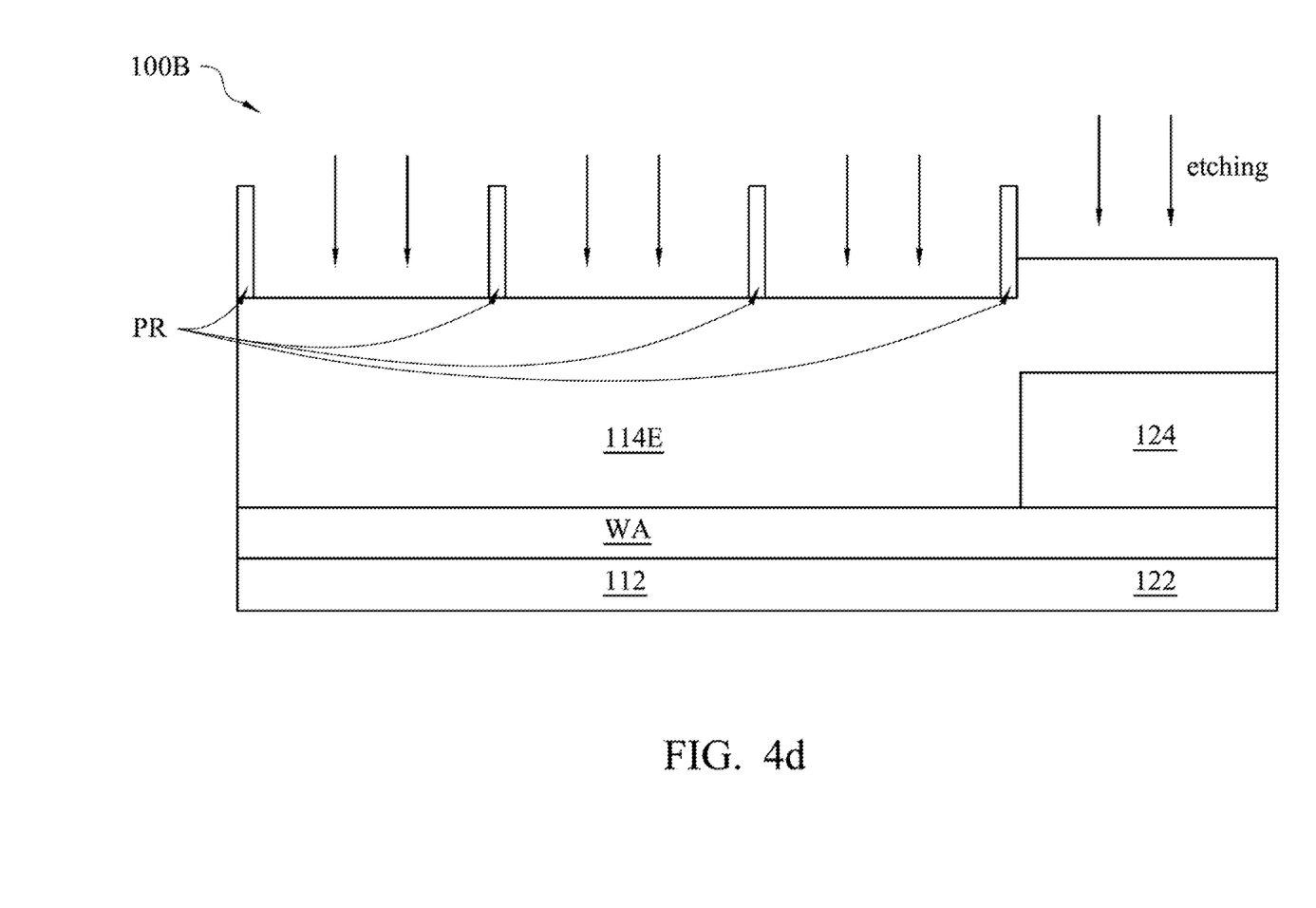
Figure 4E:
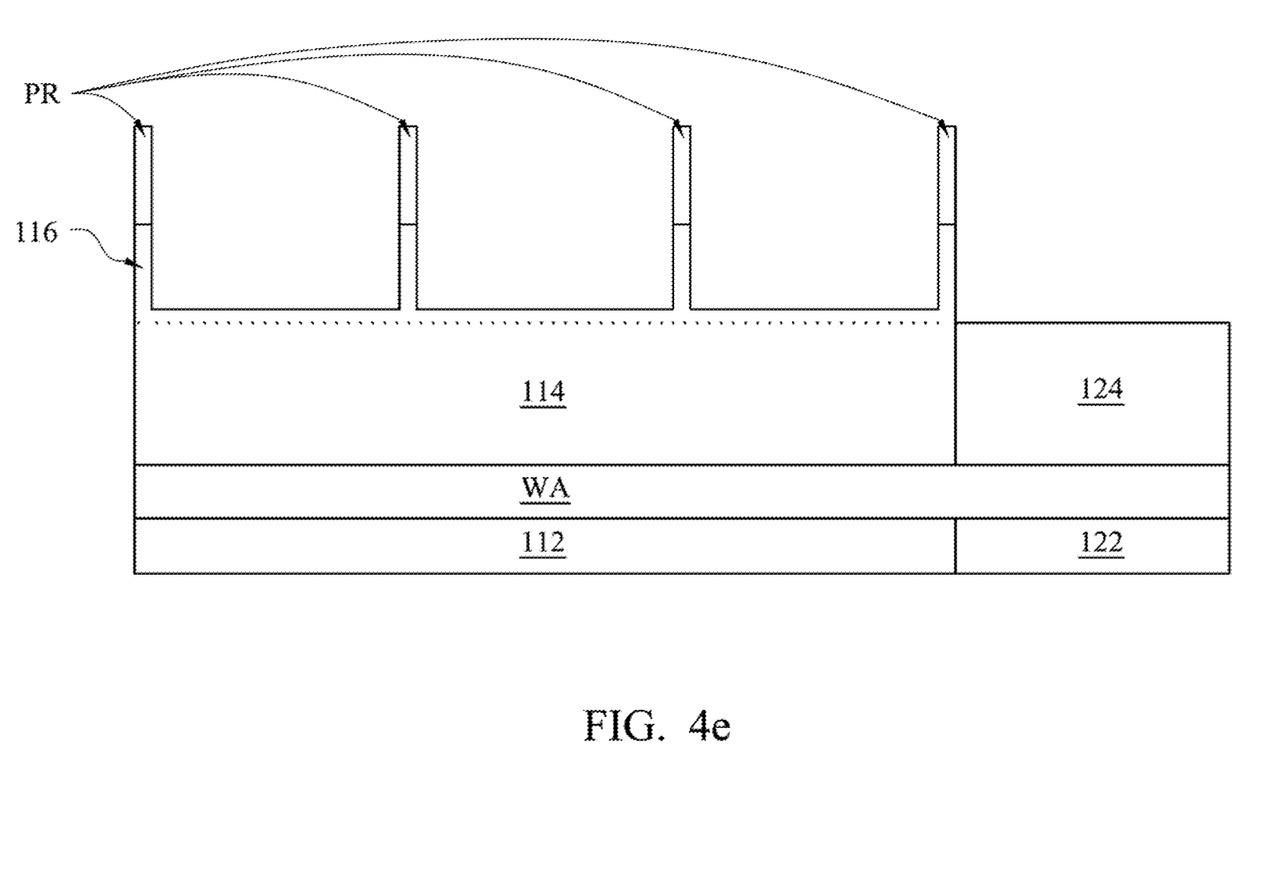

As shown in FIG. 4d, in step 1400 of the method 1000, the second device 100B is etched by an etching process until the first filter 124 is exposed. Specifically, the photoresists PR are etched to enable the remained first infrared cutoff filter 114E has the top surfaces substantially the same as the shapes of the photoresists PR, thereby forming the infrared cutoff filter grid 116 and the infrared cutoff filter 114 as shown in FIG. 4e. It is noted that the infrared cutoff filter grid 116 and the infrared cutoff filter 114 are formed by etching the first infrared cutoff filter 114E, and thus the infrared cutoff filter grid 116 and infrared cutoff filter 114 are formed in one-piece.

Figure 4F:
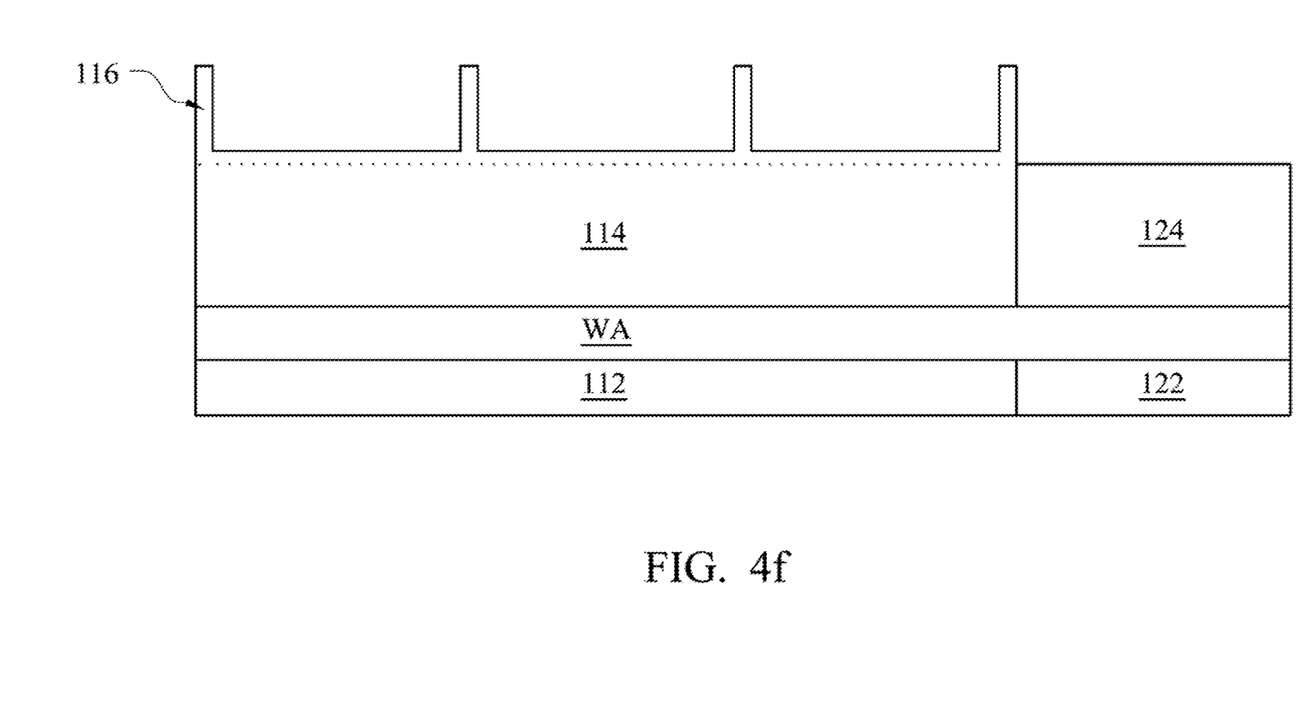
Figure 4G:
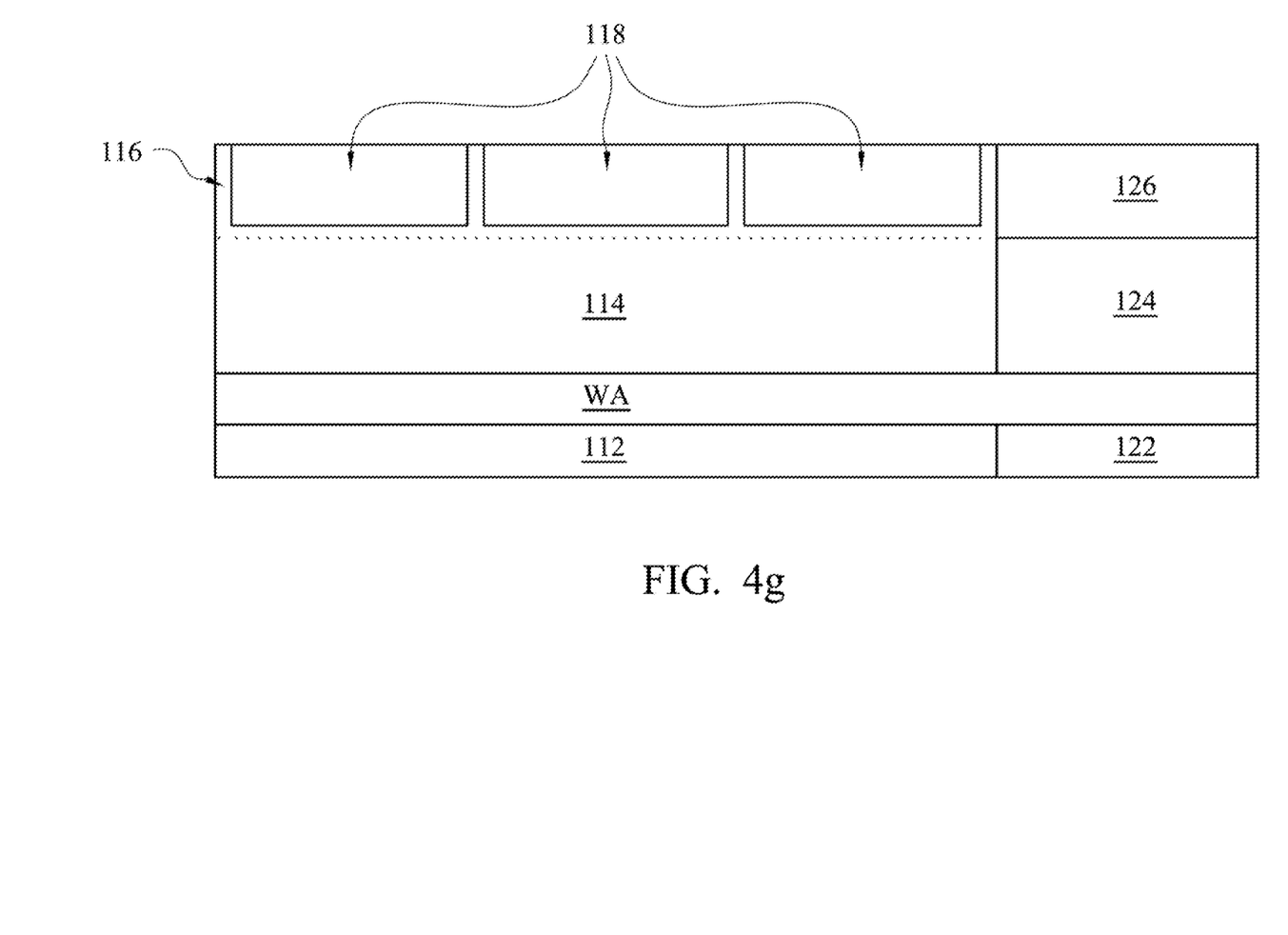

As shown in FIG. 4f, in step 1500 of the method 1000, plural photoresists PR are removed. Next, as shown in FIG. 4g, in step 1600 of the method 1000, the infrared cutoff filter grid 116 is filled with the color filter 118 and the second filter 128 is formed on the first filter 124. Finally, the spacer layer SP and the micro-lens layer ML are sequentially disposed to form the image sensor 100 as shown in FIG. 1.

From the above description, the structure of the image sensor of the present invention includes the infrared cutoff filter grid to purify the visible light, such that the visible light received by the image sensor of the present invention has a smaller noise. Furthermore, the structure of the image sensor of the present invention doesn't need a planar layer, such that the visible light and infrared received by the image sensor of the present invention have a smaller loss of the intensity.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An image sensor, comprising:
   an infrared receiving portion configured to receive infrared, and
   a visible light receiving portion configured to receive a visible light, wherein the visible light receiving portion comprises an infrared cutoff filter grid and a color filter;
   wherein the infrared cutoff filter grid has a grid structure;
   wherein the infrared cutoff filter grid is configured to block the transmission of the infrared laterally passing the color filter;
   wherein when viewed in cross section, the infrared cutoff filter grid comprises a base portion having an upper surface, and a plurality of pillar portions extending upwardly from the upper surface of the base portion, each adjacent pair of the pillar portions forming a space therebetween to thereby form a plurality of spaces;
   wherein the color filter comprises a red color filter unit, a blue color filter unit, and a green color filter unit, and each of the red color filter unit, the blue color filter unit, and the green color filter unit is filled in one of the spaces;
   wherein the visible light receiving portion further comprises a visible light photodiode and an infrared cutoff filter disposed on the visible light photodiode;
   wherein the infrared cutoff filter and infrared cutoff filter grid are formed in one-piece.

2. The image sensor of claim 1, wherein the infrared cutoff filter is configured to cutoff the infrared;
   wherein the infrared cutoff filter grid is disposed on the infrared cutoff filter, and the visible light is received by the visible light photodiode after passing through the color filter, the infrared cutoff filter grid and the infrared cutoff filter.

3. The image sensor of claim 2, wherein the infrared receiving portion comprises:

an infrared photodiode;

a first filter disposed on the infrared photodiode; and a second filter disposed on the first filter;

wherein the infrared is received by the infrared photodiode after passing through the second filter and the first filter.

4. The image sensor of claim 3, wherein one of the first filter and the second filter is an infrared pass filter, wherein the other one of the first filter and the second filter is a white filter or the infrared pass filter.

5. The image sensor of claim 3, further comprising a wafer located on the visible light photodiode and the infrared photodiode, wherein a first portion of the wafer is located in the visible light receiving portion and a second portion of the wafer is located in the infrared receiving portion.

6. The image sensor of claim 5, wherein the first portion of the wafer is located between the infrared cutoff filter and the visible light photodiode.

7. The image sensor of claim 5, wherein the second portion of the wafer is located between the first filter and the infrared photodiode.

8. The image sensor of claim 2, wherein the infrared cutoff filter and infrared cutoff filter grid are formed in one-piece.

9. The image sensor of claim 1, further comprising a micro-lens layer configured to collect the infrared and the visible light.

10. The image sensor of claim 9, wherein the micro-lens layer is located on the top of the image sensor.

11. The image sensor of claim 9, wherein the micro-lens layer is located in the visible light receiving portion and the infrared receiving portion.

12. The image sensor of claim 9, further comprising a spacer layer configured to provide a flat surface on which the micro-lens layer is disposed.

13. The image sensor of claim 12, wherein the spacer layer is located in the visible light receiving portion and the infrared receiving portion.

* * * * *